(12) United States Patent
Yen et al.

(10) Patent No.: US 9,165,746 B2
(45) Date of Patent: Oct. 20, 2015

(54) ELECTRON BEAM DRIFT DETECTION DEVICE AND METHOD FOR DETECTING ELECTRON BEAM DRIFT

(75) Inventors: Jia-Yush Yen, Taipei (TW); Yung-Yaw Chen, Taipei (TW); Yi-Hung Kuo, Taipei (TW); Cheng-Ju Wu, Taipei (TW)

(73) Assignee: National Taiwan University, Taipei (TW)

( * ) Notice: Subject to any disclaimer, the term of this patent is extended or adjusted under 35 U.S.C. 154(b) by 123 days.

(21) Appl. No.: 13/242,203

(22) Filed: Sep. 23, 2011

(65) Prior Publication Data

US 2012/0256084 A1 Oct. 11, 2012

(30) Foreign Application Priority Data

Apr. 11, 2011 (TW) .............................. 100112420 A (51) Int. Cl.
| | |
|---|---|
| *H01J 37/304* | (2006.01) |
| *H01J 37/28* | (2006.01) |
| *H01J 37/317* | (2006.01) |
| *B82Y 10/00* | (2011.01) |
| *B82Y 40/00* | (2011.01) |
| *H01J 37/22* | (2006.01) |
| *H01J 37/244* | (2006.01) |

(52) U.S. Cl.
CPC .............. *H01J 37/3174* (2013.01); *B82Y 10/00* (2013.01); *B82Y 40/00* (2013.01); *H01J 37/222* (2013.01); *H01J 37/244* (2013.01); *H01J 2237/20292* (2013.01); *H01J 2237/2448* (2013.01); *H01J 2237/24475* (2013.01); *H01J 2237/24578* (2013.01); *H01J 2237/31793* (2013.01)

(58) Field of Classification Search
CPC ....................... H01J 37/3045; H01J 2237/1501
USPC .......................................................... 250/310
See application file for complete search history.

(56) References Cited

U.S. PATENT DOCUMENTS

| | | | | |
|---|---|---|---|---|
| 5,134,298 A | * | 7/1992 | Inagaki et al. | 250/491.1 |
| 5,757,015 A | * | 5/1998 | Takemoto et al. | 250/491.1 |
| 2009/0101817 A1 | * | 4/2009 | Ohshima et al. | 250/310 |

OTHER PUBLICATIONS

Saitou et al., 'Computer Controlled Electron Beam Microfabrication Machine with a New Registration System' Jul. 1974, Journal of Physics E, vol. 7, p. 441-444.*

(Continued)

*Primary Examiner* — Robert Kim
*Assistant Examiner* — Eliza Osenbaugh-Stewar
(74) *Attorney, Agent, or Firm* — Mintz Levin Cohn Ferris Glovsky and Popeo, P.C.; Peter F. Corless; Steven M. Jensen (57) ABSTRACT

An electron beam drift detection device and a method for detecting electron beam drift are provided in which the method includes placing a predetermined characteristic identification pattern on a surface of a workpiece; emitting an electron beam, and focusing and deflecting the electron beam such that the focused and deflected electron beam scans the surface of the workpiece and the characteristic identification pattern; detecting backscattered electrons and secondary electrons; and receiving detection signals and performing an image process on the detection signals to obtain an electronic image of the characteristic identification pattern, and measuring a drift degree by comparing the electronic image with the predetermined shape of the characteristic identification pattern.

14 Claims, 7 Drawing Sheets

(56) References Cited

OTHER PUBLICATIONS

Holiday et al., 'Improved longitudinal magneti-optic Kerr effect signal contrast from nanomagnets with dielectric coatings' Dec. 25, 2006, Optics Express, vol. 14, No. 26, pp. 13007-13013.*

Kuo et al., "Silicon photodiodes for electron beam position and drift detection in scanning electron microscopy and electron beam lithography system", Nuclear Instuments and Methods in Physics Research A, vol. 645, pp. 84-89 (2011).

* cited by examiner

ELECTRON BEAM DRIFT DETECTION DEVICE AND METHOD FOR DETECTING ELECTRON BEAM DRIFT

CROSS-REFERENCES TO RELATED APPLICATIONS

This application claims under 35 U.S.C. §119(a) the benefit of Taiwanese Application No. 100112420, filed Apr. 11, 2011, the entire contents of which is incorporated herein by reference.

BACKGROUND OF THE INVENTION

1. Field of the Invention

The present invention relates to an electron beam lithography technology, and, more specifically, to the use of an electron beam drift detection device and a suitable detection method.

2. Description of Related Art

With advancement in semiconductor technology, the downscaling of semiconductor devices, for example, devices assembled in personal computers and mobile communication devices becomes overwhelming. In addition, the wiring and the transistor size of semiconductor devices are scaled down to further enhance the integration of semiconductor devices. Therefore, lithography technology became very important. The known lithography technology mentioned previously includes the following steps: scanning a beam of electrons in a patterned fashion across a substrate surface covered with a film called the resist, exposing the resist and selectively removing exposed regions of the resist. The purpose of this is to create very small structures in the resist that can subsequently be transferred to the substrate material, often by etching.

It can be seen that an accurate and reliable lithography technology is needed because of a high demand for enhancing the integration of integrated circuits. Therefore, an electron beam lithography technology (such as e-beam) using the charged-particle beam has been developed because a conventional lithography technology cannot achieve more precise patterning.

However, it is well known that electron beam direct-write lithography has a common problem due to the electron beam position varying over time. This often affects the accuracy of lithography patterning, and thus affecting the image resolution of the entire semiconductor patterning. Additionally, when the electron beam is fixed at one point, the beam drift cannot be detected easily because of the charging effect. As a result, the signal of the backscattered electron detector or the secondary electron detector is inaccurate and the position of the signal cannot be measured completely.

Therefore, the desire to develop a low-cost, high-precision detection device for electron beam direct-write lithography system and a method for detecting the electron beam drift have become very important in order to overcome the problems encountered in known lithography technology

SUMMARY OF THE INVENTION

In view of the disadvantages encountered in known lithography technology, the primary object of the present invention is to provide a highly cost-effective detection device for an electron beam direct writing lithography system. The electron beam drift varying over time can be detected accurately.

A further object of the present invention is to provide a simplified detection method for detecting the electron beam drift. Therefore, the resolution of the electron beam drift detection can be increased.

To achieve these objects above, the present invention provides an electron beam drift detection device detecting the phenomenon of the electron beam drift for electron an beam direct writing lithography system, including: a characteristic identification pattern placed on a surface of a workpiece and having a predetermined shape; an electron beam emission module used for emitting an electron beam, the electron beam emission including an electron beam focus and deflection coil module that focuses and deflects the electron beam such that the focused and deflected electron beam scans the surface of the workpiece and the characteristic identification pattern; a backscattered electron and secondary electron detection module detecting backscattered electrons and secondary electrons generated as a result of action of the focused and deflected electron beam upon the surface of the workpiece and the characteristic identification pattern, and thus providing corresponding detection signals; and an image processing module receiving the detection signals and performing an image process on the detection signals in order to obtain electronic image of the characteristic identification pattern, and measuring a drift degree of the electronic beam by comparing the electronic image and the predetermined shape of the characteristic identification pattern.

In addition, the invention provides a detection method for detecting the electron beam drift by an electron beam drift detection device. The method includes: providing a workpiece; placing on a surface of the workpiece a predetermined characteristic identification pattern having a predetermined shape; emitting an electron beam, and focusing and deflecting the electron beam such that the focused and deflected electron beam scans the surface of the workpiece and the characteristic identification pattern; detecting backscattered electrons and secondary electrons generated as a result of action of the focused and deflected electron beam upon the surface of the workpiece and the characteristic identification pattern, and thus providing corresponding detection signals; and receiving the detection signals and performing an image process on the detection signals to obtain an electronic image of the characteristic identification pattern, and measuring a drift degree by comparing the electronic image with the predetermined shape of the characteristic identification pattern.

Compared to known lithography technology, the present invention not only can effectively detect the electron beam drift varying over time in a single electron beam or a multi-electron beam direct writing lithography system, but can also provide a simplified, low-cost detection method for detecting the drift. Accordingly, the detection and feedback mechanism increases the quality of semiconductor device fabrication. The discontinuity caused by the electron beam drift can be improved.

DETAILED DESCRIPTION OF PREFERRED EMBODIMENTS

The following embodiment further illustrates embodiments of the present invention. The advantages and efficiency of the present invention can be readily understandable through this description. However, the description should not be deemed to be a limitation on the scope of the invention. Accordingly, various modifications, adaptations and alternatives may occur to one skilled in the art without departing from the spirit and scope of the claimed inventive concept.

Figure 1:
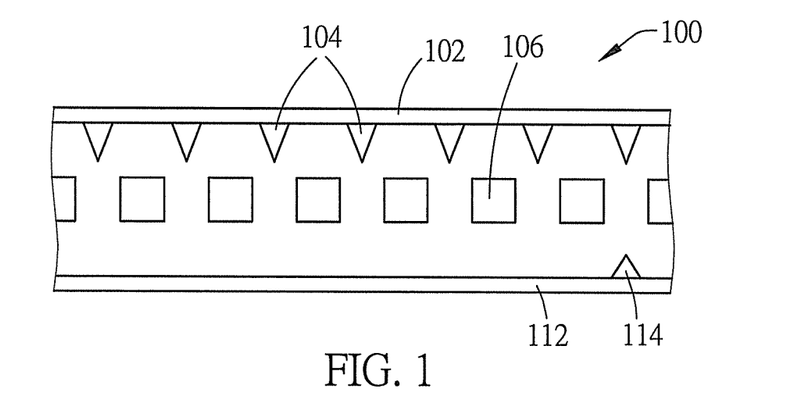
FIG. 1 illustrates a local cross-sectional view of a multi-electron beam lithography device using a single characteristic identification pattern according to an embodiment of the present invention.

FIG. 1 shows a cross-sectional view of a multi-electron beam lithography device 100 using a single characteristic identification pattern 114 according to an embodiment of the present invention. The multi-electron beam lithography 100 includes an electron beam emission module 102. The electron beam emission module 102 is used to pattern the workpiece 112. The characteristic identification pattern 114 is placed on the workpiece. The electron beam emission module 102 includes an electron beam emission head 104 and an electron beam focus and deflection coil module 106.

The electron beam emission head 104 is used to emit the electron beam. The present invention can also use the charged-particle beam. For ease of explanation, the electron beam is used in this specification. The electron beam is focused by the electron beam focus and deflection coil module 106 so that it scans a characteristic identification pattern 114 over an area of the workpiece 112 surface. Due to relative displacement between the electron beam emission module 102 and the workpiece 112, the electron beam can be used to image or scan the workpiece 112.

When the operating time increases, the electron beam emission module 102 may occur a common problem due to the electron beam drift. In other words, the electron beam position varies over time. The precision of lithography patterns will be reduced and thereby the reliability of overall semiconductor fabrication will be affected. Furthermore, when the electron beam is fixed at one point, the electron beam drift cannot be detected easily due to the charging effect. As a result, signals of the backscattered electron detector or the secondary electron detector are inaccurate and the position of the signals cannot be measured completely.

Therefore, the present invention provides a characteristic identification pattern 114 which is placed on the surface of the workpiece 112. First of all, the characteristic identification pattern 114 will be scanned by the electron beam emission module 102. Next, the electronic image can be obtained by the backscattered electron and secondary electron detection module (not shown in FIG. 1) due to the signals recorded. The electronic image of the characteristic identification pattern 114 can be processed by image processing in order to obtain the electron beam drift varying over time (details to be given later).

Figure 2:
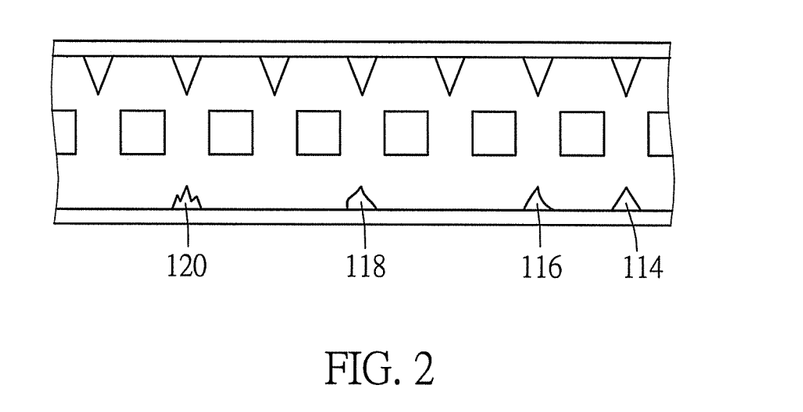
FIG. 2 is a local cross-sectional view of a multi-electron beam lithography device using multiple characteristic identification patterns according to an embodiment of the present invention.

In another embodiment of the present invention, the electron beam drift of the image processing can be fed back to the electron beam emission module 102. Based on adjusting the relative displacement between the electron beam emission module 102 and the workpiece 112, the negative impact on fabrication precision caused by the electron beam drift can be reduced. Therefore, in order to get more reference points of the electronic drift, more characteristic identification patterns can be placed on the surface of the workpiece 112 (as shown in FIG. 2). With similar methods, more reference images of the electron beam drift can be obtained by obtaining more electronic images of the characteristic identification patterns in different positions. In addition, more accurate feedback mechanism of the electron beam drift can be obtained due to the more reference images processed by image processing. Based on the calibration of the electron beam emission position varying over time, the accuracy of the lithography pattern can be improved.

Referring to FIG. 2, more characteristic identification patterns 114, 116, 118 and 120 are placed on the surface of the workpiece 112. The electron beam emission module 102 scans these characteristic identification patterns 114, 116, 118 and 120. Subsequently, electronic images can be obtained by the backscattered electron and secondary electron detection module (not shown in FIG. 1) due to the corresponding signals recorded. Therefore, the electronic images of the characteristic identification patterns 114, 116, 118 and 120 will be processed by image processing in order to obtain the drift of the characteristic identification patterns 114, 116, 118, 120 which are scanned by the electron beam.

In the technical area, one should realize that the feedback accuracy of the electron beam drift can be improved through any of, or many of the characteristic identification patterns 114, 116, 118 and 120 used as feedback reference points of the electron beam drift. On the other hand, each individual electron beam emission head emitting an electron beam may have a different electron beam drift. Hence, each individual electron beam emission head can be adjusted by the feedback control, based on one or more characteristic identification patterns which are used as feedback reference points of the individual electron beam emission head.

Figure 3:
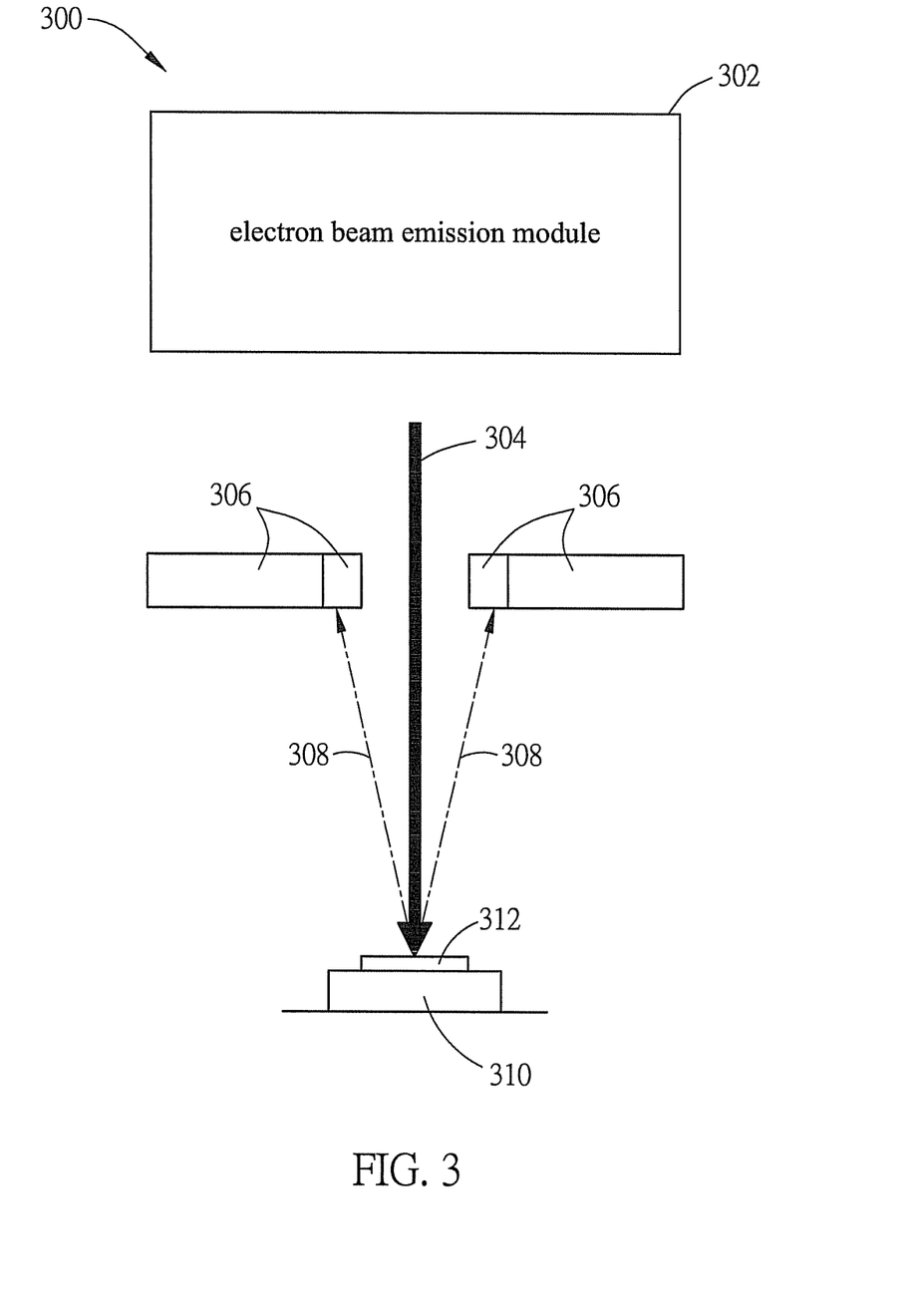
FIG. 3 illustrates a schematic view of the electron beam detection device according to an embodiment of the present invention.

FIG. 3 shows a schematic view of the electron beam detection device according to an embodiment of the present invention. The electron beam drift detection device 300 includes an electron beam emission module 302, an electron detection module 306 (used to detect backscattered electrons and secondary electrons) and a workpiece stationary base 310 used to fix the workpiece 312, as shown in FIG. 3.

The electron beam drift detection device 300 is not only limited to applications in a single electron beam direct writing lithography system. It can also be applied to a multi-electron beam direct writing lithography system in order to detect the drift phenomenon of one or multiple electron beams 304. Referring to FIG. 3, the workpiece 312 can be a semiconductor wafer or a semiconductor substrate. One or more characteristic identification patterns (not shown in FIG. 3) are placed on the workpiece. The characteristic identification pattern is placed in a specific position on the surface of the workpiece 312. Apart from the predetermined shape for identification (details to be given later in FIG. 4, for example: tapered shape or conical shape), the characteristic identification pattern mainly adopts a substrate, of which this is not easy to deform due to the effect of the electron beam.

The electron beam emission module 302 emitting an electron beam also includes an electron beam focus and deflection coil module (not shown) for focusing and deflection, while the relative displacement between the electron beam emission module 302 and the workpiece 312 can be obtained. Therefore, the electron beam, which has been focused and deflected, scans the surface of the workpiece 312 and the characteristic identification pattern.

The electronic detection module 306 can be a backscattered electron detector or a secondary electron detector used for detecting the backscattered electrons and secondary electrons, when the electron beam, which has been focused and deflected, interacts with the workpiece 312 or the characteristic identification pattern. Hence, the corresponding detection signals will be produced. In this embodiment, the electronic detection module 306 can be, but is not limited to, a silicon photodiode detector.

In an embodiment of the present invention, the electron beam drift detection device 300 further includes an image processing module (not shown herein) receiving the detection signals detected from the electronic detection module 306 and subsequently processing the detection signals in order to obtain an electronic image of the corresponding characteristic identification pattern. (details to be given later in FIGS. 5B and 5C). In accordance with the comparison between the predetermined shape of the characteristic identification pattern and the electronic image, the electron beam drift can be measured.

Figure 4:
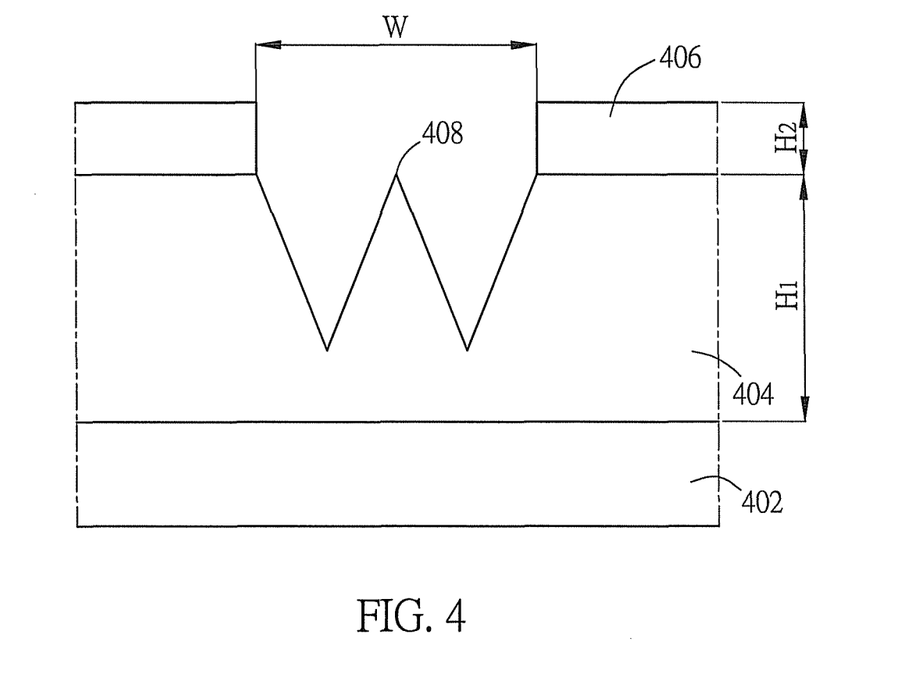
FIG. 4 is a cross-sectional view of a characteristic identification pattern placed on the workpiece surface or the semiconductor substrate according to an embodiment of the present invention.

FIG. 4 illustrates a cross-sectional view of a characteristic identification pattern 408 placed on the surface of the workpiece 402 or the semiconductor wafer/substrate according to an embodiment of the present invention. The workpiece 402 is a silicon substrate or a group III-V substrate. The characteristic identification pattern 408 adopting an electron beam resist-coated material (for example, silicon dioxide ($SiO_2$ or other metal oxides, etc.) forms the surface of the workpiece 402. Additionally, the characteristic identification pattern 408 should have a shape predetermined. Based on the record of the predetermined shape, the shape can be compared to the electronic image of the characteristic identification pattern 408 in order to obtain the electron beam drift. The characteristic identification pattern 408 is formed by a material 404 with a thickness $H_1$ and an opening width W, as shown in FIG. 4. A protection material 406 (such as chromium (Cr)) is also placed on the material 404.

To facilitate explanation, all embodiment in the description uses the characteristic identification pattern 408 of FIG. 4 as an examplary illustration, but it is not limited to this.

Figure 5A:
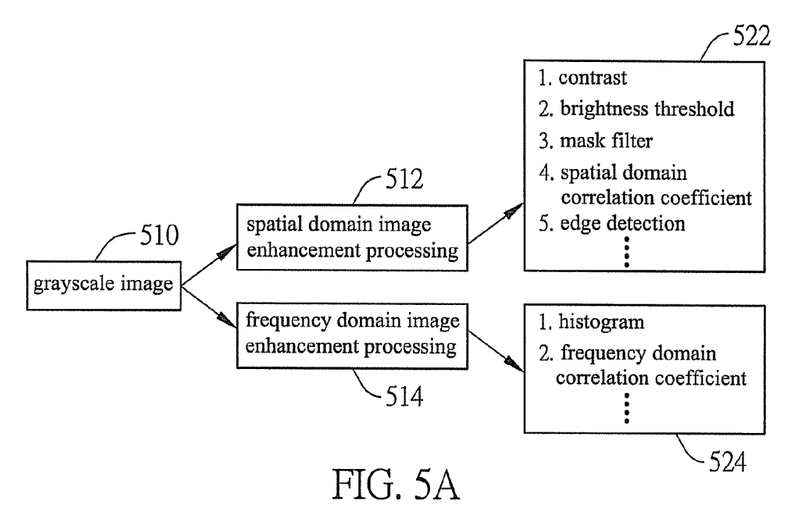
FIG. 5A shows a block diagram of the image processing module according to an embodiment of the present invention for image enhancement processing.

FIG. 5A a block diagram of the image processing module for image enhancement processing according to an embodiment of the present invention. In general, a grayscale image can be processed by the image processing module of this embodiment, wherein the image processing module also includes spatial domain image enhancement processing 510 and frequency domain image enhancement processing 512. Spatial domain image enhancement processing further comprises many image processes, such as contrast, brightness threshold, mask filter, spatial domain correlation coefficient and edge detection, etc. Frequency domain image enhancement processing further comprises many image processes 524, such as histogram, frequency domain correlation coefficient, etc.

Figure 5B:
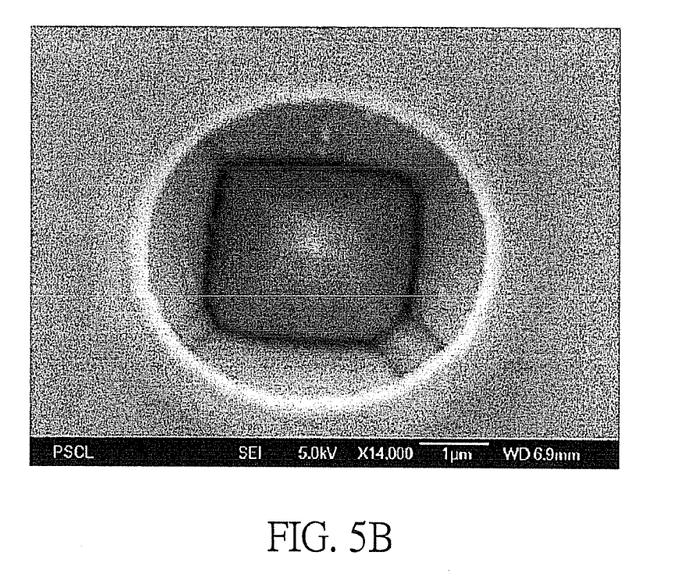
FIG. 5B is an image of backscattered electrons obtained from a silicon photodiode detector according to an embodiment of the present invention.

FIG. 5B shows an image of backscattered electrons obtained from a silicon photodiode detector according to an embodiment of the present invention. The electron beam emission module 302 scans the characteristic identification pattern 408 and thus produces an electronic image from the electronic detection module 306.

Figure 5C:
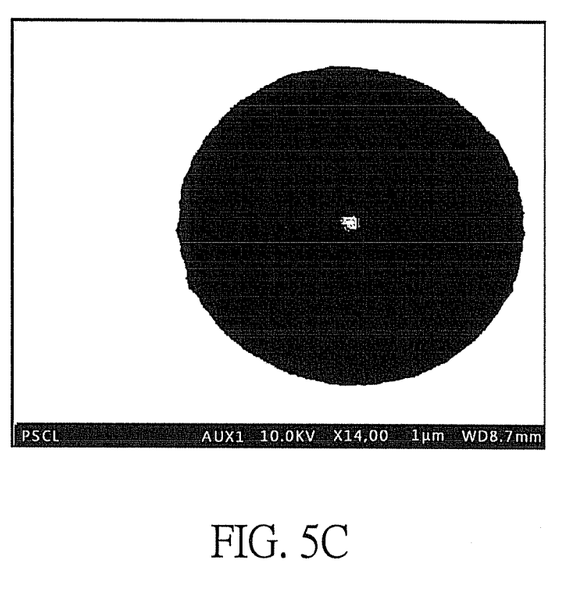
FIG. 5C is an image of backscattered electrons processed by the image enhancement processing.

FIG. 5C is an image of backscattered electrons processed by image enhancement processing. The backscattered electron image processed by image enhancement processing clearly shows a tip position of the characteristic identification pattern 408. The electron beam drift detection device can achieve a resolution of 0.6 nm, comparing to known electron beam drift detection technology only achieving a resolution of 15 nm to 20 nm. Therefore, the electron beam drift feedback and calibration mechanism of an electron beam direct writing lithography system can be improved in order to achieve a more accurate lithography image.

Figure 6:
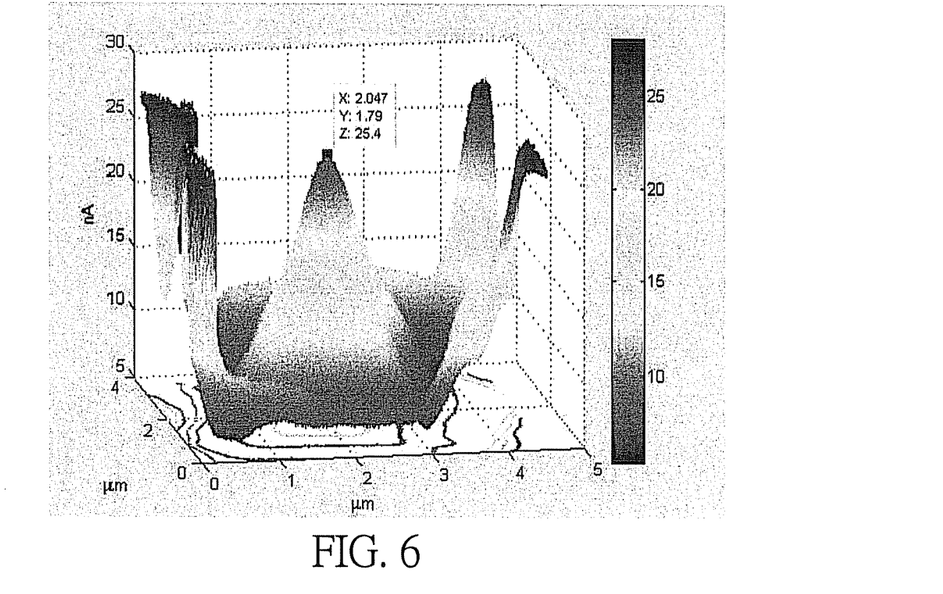
FIG. 6 is a three-dimensional view of the characteristic identification pattern processed by image processing.

In addition, with variation of time, an image obtained from the electronic detection module 306 can be processed by other image processing in order to obtain other results for referencing. FIG. 6 is a three-dimensional view of the characteristic identification pattern processed by image processing. The graph shows different tip positions of the characteristic identification pattern 408 on a coordinate system.

Figure 7:
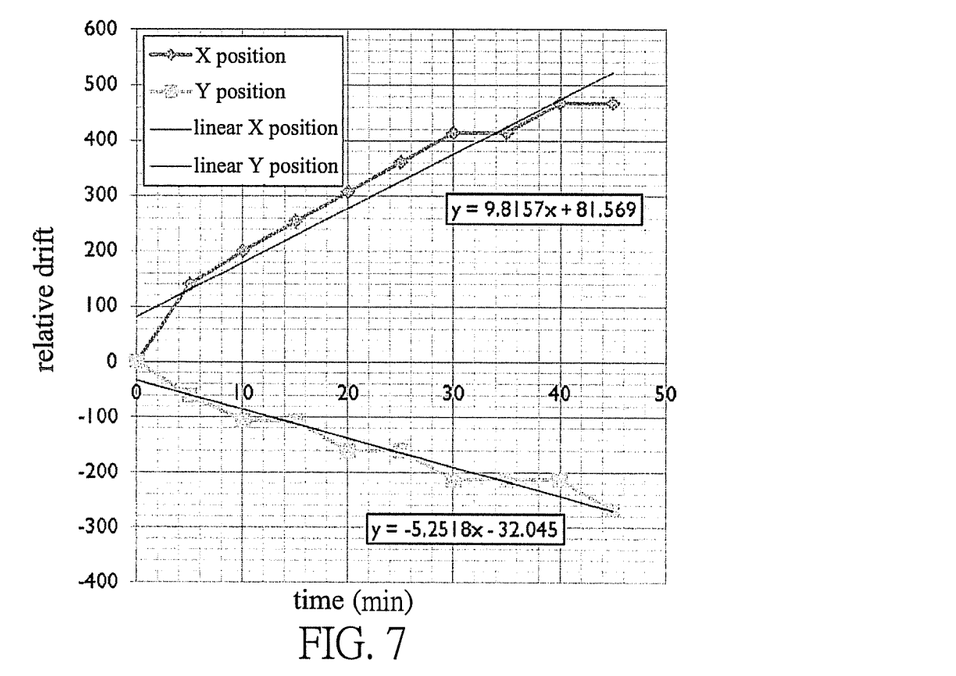
FIG. 7 shows the relative drift (at the tip position) of the electronic image processed statistically by image processing with variation of time.

FIG. 7 shows the relative drift (at the tip position) of the electronic image processed statistically by image processing with variation of time. The electron beam drift tends to be more serious and have a linear relationship to a certain extent.

Figure 8:
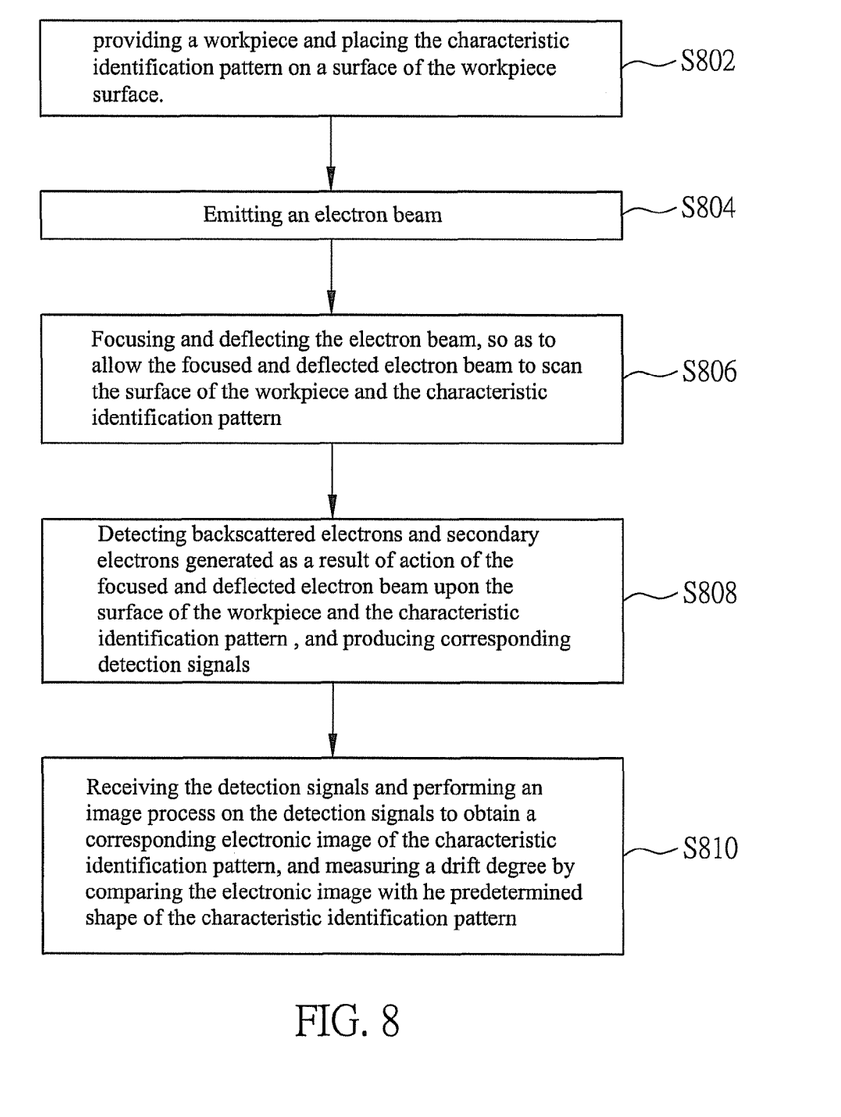
FIG. 8 shows a flow chart of the electron beam drift detection method according to an embodiment of the present invention.

According to the disclosure of the embodiment of the present invention, the electron beam drift detection method is also proposed, apart from use of the electron drift detection device. The detection method can be applied to a single electron beam or multi-electron beam direct writing lithography system in order to detect the electron beam drift phenomenon. FIG. 8 shows a flow chart of the electron beam drift detection method according to the embodiment of the present invention. In this embodiment, the electron beam detection method can be implemented by using the electron beam drift detection device according to the present invention.

First of all, step S802 is to set up a workpiece and thus to place the characteristic identification pattern in a specific position on the surface of the workpiece. Go to step S804 subsequently.

The purpose of step S804 is to emit an electron beam, and this step is followed by step S806.

Step S806 is to focus and deflect the electron beam, so that the surface of the workpiece and the characteristic identification pattern can be scanned by the electron beam, which has been focused and deflected. Later on, go to step S808.

Step S808 is to detect backscattered electrons and secondary electrons that are ejected from the surface of the workpiece and the characteristic identification pattern interacted with the electron beam, which has been focused and deflected, in order to produce corresponding detection signals. Go to S810 thereafter.

Step S810 is to receive the detection signals that are processed by image processing in order to obtain a corresponding electronic image of the characteristic identification pattern. In accordance with the comparison between the electronic image and the predetermined shape of the characteristic identification pattern, the electron beam drift (drift degree) can be measured. Lastly, the detection procedure is to be finished.

In summary, the electron beam drift detection device and electron beam drift detection method of the present invention can be used in an electron beam direct writing lithography system. When an electron beam is emitted with the variation of time, the drift phenomenon is produced. The purpose of the present invention is to obtain a further reduction of the electron beam drift when varying over time. In addition, the electron beam drift detection device and the electron beam drift detection method are able to use known electronic detector to effectively measure the electron beam drift phenomenon without using a specific design of the backscattered electron or secondary electron detector. Furthermore, compared to known electron beam drift detection technology, the electron beam detection device and the electron beam drift detection method can further achieve a more accurate resolution.

The preferred embodiment has been set forth herein for the purpose of illustration. However, the description should not be deemed to be a limitation on the scope of the invention. Accordingly, various modifications, adaptations and alternatives may occur to one skilled in the art without departing from the spirit and scope of the claimed inventive concept.

What is claimed is:

1. An electron beam drift detection device, comprising:
   a characteristic identification pattern placed on a portion of a surface of a workpiece and having a predetermined shape, wherein the characteristic identification pattern is formed by an electron beam resist-coated material with an opening, and a protection material is placed on the electron beam resist-coated material such that the characteristic identification pattern is exposed from the opening;
   an electron beam emission module used for emitting an electron beam, the electron beam emission module including an electron beam focus and deflection coil module that focuses and deflects the electron beam such that the focused and deflected electron beam scans the surface of the workpiece and the characteristic identification pattern;
   a backscattered electron and secondary electron detection module detecting backscattered electrons and secondary electrons generated as a result of action of the focused and deflected electron beam upon the surface of the workpiece and the characteristic identification pattern, and thus providing corresponding detection signals; and
   an image processing module receiving the detection signals and performing an image process on the detection signals in order to obtain electronic image of the characteristic identification pattern, and measuring a drift degree of the electron beam by comparing the electronic image and the predetermined shape of the characteristic identification pattern.

2. The electron beam drift detection device according to claim 1, wherein the workpiece is a semiconductor wafer or a silicon substrate.

3. The electron beam drift detection device according to claim 1, wherein the characteristic identification pattern has a tip profile.

4. The electron beam drift detection device according to claim 1, wherein the backscattered electron and secondary electron detection module is a silicon photodiode detector.

5. The electron beam drift detection device according to claim 1, wherein the image processing module compares the electronic image and the predetermined shape of the characteristic identification pattern with respect to their sizes, positions and edges.

6. An electron beam drift detection method, comprising:
   providing a workpiece;
   placing on a portion of a surface of the workpiece a predetermined characteristic identification pattern having a predetermined shape, wherein the characteristic identification pattern is formed by an electron beam resist-coated material with an opening, and a protection material is placed on the electron beam resist-coated material such that the characteristic identification pattern is exposed from the opening;
   emitting an electron beam, and focusing and deflecting the electron beam such that the focused and deflected electron beam scans the surface of the workpiece and the characteristic identification pattern;
   detecting backscattered electrons and secondary electrons generated as a result of action of the focused and deflected electron beam upon the surface of the workpiece and the characteristic identification pattern, and thereby providing corresponding detection signals; and
   receiving the detection signals and performing an image process on the detection signals to obtain an electronic image of the characteristic identification pattern, and measuring a drift degree by comparing the electronic image with the predetermined shape of the characteristic identification pattern.

7. The electron beam drift detection method according to claim 6, wherein the workpiece is a semiconductor wafer or a silicon substrate.

8. The electron beam drift detection method according to claim 6, wherein the characteristic identification pattern has a tip profile.

9. The electron beam drift detection method according to claim 6, wherein the backscattered electrons and secondary electrons are detected by a silicon photodiode detector.

10. The electron beam drift detection method according to claim 6, wherein the electronic image and the predetermined shape of the characteristic identification pattern are compared with respect to their sizes, positions and edges.

11. The electron beam drift detection device according to claim 1, wherein the characteristic identification pattern is distinct from the workpiece.

12. The electron beam drift detection device according to claim 1, wherein the electron beam resist-coated material is silicon dioxide or metal oxide.

13. The electron beam drift detection method according to claim 6, wherein the characteristic identification pattern is distinct from the workpiece.

14. The electron beam drift detection method according to claim 6, wherein the electron beam resist-coated material is silicon dioxide or metal oxide.

* * * * *